US006559029B2

(12) United States Patent
Hur

(10) Patent No.: US 6,559,029 B2
(45) Date of Patent: May 6, 2003

(54) METHOD OF FABRICATING SEMICONDUCTOR DEVICE HAVING TRENCH ISOLATION STRUCTURE

(75) Inventor: Sung-Hoi Hur, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/174,896

(22) Filed: Jun. 17, 2002

(65) Prior Publication Data

US 2002/0190342 A1 Dec. 19, 2002

(30) Foreign Application Priority Data

Jun. 19, 2001 (KR) ........................................ 2001-34735

(51) Int. Cl.$^7$ .............................................. H01L 21/76
(52) U.S. Cl. ...................................................... 438/427
(58) Field of Search ................................. 438/424, 427, 438/700

(56) References Cited

U.S. PATENT DOCUMENTS

| | | | | |
|---|---|---|---|---|
| 5,298,450 A | * | 3/1994 | Verret ........................ | 438/427 |
| 5,385,861 A | * | 1/1995 | Bashir et al. ............... | 438/427 |
| 5,504,033 A | * | 4/1996 | Bajor et al. ................. | 438/427 |
| 5,646,063 A | * | 7/1997 | Metha et al. ............... | 438/427 |
| 5,683,932 A | * | 11/1997 | Bashir et al. ............... | 438/427 |
| 5,691,232 A | * | 11/1997 | Bashir et al. ............... | 438/427 |
| 5,817,568 A | * | 10/1998 | Chao .......................... | 438/427 |
| 5,893,744 A | * | 4/1999 | Wang ......................... | 438/401 |
| 5,950,093 A | * | 9/1999 | Wei ............................ | 438/401 |
| 6,207,534 B1 | * | 3/2001 | Chan et al. ................. | 438/427 |
| 6,406,976 B1 | * | 6/2002 | Singh et al. ................ | 438/423 |

FOREIGN PATENT DOCUMENTS

| | | | | |
|---|---|---|---|---|
| JP | 10-12716 | * | 10/1998 | .......... H01L/21/76 |
| KR | 1999-0042687 | | 6/1999 | |

OTHER PUBLICATIONS

English language abstract of Korean Publication No. 1999-0042687.

* cited by examiner

Primary Examiner—Carl Whitehead, Jr.
Assistant Examiner—David S Blum
(74) Attorney, Agent, or Firm—Marger Johnson & McCollom, P.C.

(57) ABSTRACT

The present invention provides a method of fabricating a semiconductor device having a trench isolation structure. The method includes the following steps. A hard mask layer is formed on the semiconductor substrate having a cell array region and a peripheral circuit region. The hard mask layer is patterned to expose the semiconductor substrate. Thus, a hard mask pattern is formed to define a first isolation region at the cell array region and simultaneously to define a second isolation region at the peripheral circuit region. A sacrificial material layer is conformally formed at the entire surface of the second isolation region and the hard mask pattern of the peripheral circuit region and fills a gap region between the hard mask patterns of the cell array region. The sacrificial material layer and the semiconductor substrate are sequentially etched to form a first trench region and a second trench region at the cell array region and the peripheral circuit region, respectively. The first trench region is shallower than the second trench region.

12 Claims, 6 Drawing Sheets

US 6,559,029 B2

METHOD OF FABRICATING SEMICONDUCTOR DEVICE HAVING TRENCH ISOLATION STRUCTURE

RELATED APPLICATION

This application relies for priority upon Korean Patent Application No. 2001-34735, filed on Jun. 19, 2001, the contents of which are herein incorporated by reference in their entirety.

FIELD OF THE INVENTION

The present invention relates to a method of fabricating a semiconductor device, and more particularly to a method of fabricating a semiconductor device having a trench isolation structure.

BACKGROUND OF THE INVENTION

As semiconductor devices become highly integrated, widths of isolation layers become decreased for electrically isolating devices. Especially, in case of a trench isolation technique which has solved several problems of a LOCOS isolation technique, as semiconductor devices become highly integrated, an aspect ratio of a trench which is formed at a semiconductor substrate is increased, thereby creating a problem whereby it is difficult to fill the trench.

FIGS. 1 through 4 are cross-sectional views for explaining a conventional method of fabricating a trench isolation structure.

Referring to FIG. 1, a hard mask pattern 102a is formed to define a first isolation region 104 at a cell array region 'a' and a second isolation region 105 at a peripheral region 'b'. In order to form the hard mask pattern 102a, a buffer oxide layer 101 and a hard mask layer are formed on the semiconductor substrate and sequentially patterned.

Referring to FIG. 2, the semiconductor substrate 100 is etched using the hard mask pattern 102a as an etch mask, to form trench regions T1 at the cell array region 'a' and the peripheral circuit region 'b'. Thus, the trench regions T1 for forming a conventional trench isolation layer have the same depth regardless of the cell array region 'a' of a high pattern density and the peripheral circuit regions 'b' of a low pattern density.

Referring to FIG. 3, an insulation layer 107 is formed over the entire surface of the resultant structure where the trench region T1 is formed, to fill the trench region. As seen in FIG. 2, in the conventional method of fabricating the trench isolation, trench regions T1 of the same depth are formed regardless of the pattern density. Thus, as semiconductor devices become more highly integrated, when the insulation layer 107 is formed to fill the trench region T1, a void B can be generated at the cell array region 'a' of the high pattern density. By using a material layer having a superior burial characteristic, for example, a $O_3$-TEOS oxide layer or a high density plasma (HDP) CVD layer, as an insulation layer for filling the trench region T1, it is possible to increase the burial characteristic of the insulation layer. But, in the conventional method, despite using the material layer having a superior burial characteristic, if the aspect ratio of the trench region is high, there remains a high probability that the void B' occurs.

Referring to FIG. 4, the insulation layer 107 is etched by using a chemical mechanical polishing (CMP) process to expose the top of the hard mask pattern 102a. And, the hard mask pattern 102a and the buffer oxide layer 101 are removed to form isolation layers 107a and 107b filling the trench region T1, and at the same time, to expose active regions between the isolation layers 107a and 107b. At this time, at the step of forming the insulation layer 107, the void B of the cell array region 'a' is exposed, so that a groove B' is formed at the top of the isolation layer 107a of the cell array region of the high pattern density and this produces an undesirable effect on the characteristic of a semiconductor device.

As described above, the conventional method of fabricating trench isolation simultaneously forms trench regions at a cell array region of a high pattern density and at a peripheral circuit region of a low pattern density. Thus, for a device isolation of a peripheral circuit where high voltage is applied, a trench region should be formed deeply, and thus, a void can be generated at a cell array region of high pattern density. Thus, it is required to form a shallow trench at the cell array region of the high pattern density and a relatively deep trench region at the peripheral circuit region.

The Korean laid-open patent number 1999-0042687 provides a method of fabricating trench regions having each different depth at a cell array region and a peripheral circuit region. But, the method includes twice as many photolithography processes for forming the trench regions at the cell array region and the peripheral circuit region. Thus, the process is complicated and has a problem of degrading a characteristic of the interface between an isolation layer and a semiconductor substrate, since a first formed trench region, out of trench regions formed at a cell array region and at a peripheral circuit region, is covered by a photoresist.

SUMMARY OF THE INVENTION

Thus, it is an object of the present invention to provide a method of fabricating a semiconductor device which has trench isolation structures of different thicknesses at a cell array region of a high pattern density, and at a peripheral circuit region of a low pattern density without addition of a photolithography process.

In order to approach the object, the present invention provides a method including the following steps. A hard mask layer is formed on a semiconductor substrate having a cell array region and a peripheral circuit region. The hard mask layer is patterned to expose the semiconductor substrate. Thus, a hard mask pattern is formed to define a first isolation region at the cell array region and a second isolation region at the peripheral circuit region. A sacrificial material layer is formed at the entire surface of the resultant structure where the hard mask pattern is formed. The sacrificial material layer is conformally formed over the entire surface of the second isolation region and the hard mask pattern of the peripheral circuit region, and fills a gap region between the hard mask patterns of the cell array region. The sacrificial material layer and the semiconductor substrate are sequentially etched to form a first and a second trench regions at the cell array region and the peripheral circuit region, respectively. The first trench region is shallower than the second trench region.

Further, after forming an insulation layer filling the first and second trench regions, the insulation layer is etched by using a CMP process to expose the hard mask layer and simultaneously to form an isolation layer at the first and second trench regions. Then, the hard mask layer is removed to expose the semiconductor substrate between the isolation layers.

DESCRIPTION OF THE PREFERRED EMBODIMENT

The present invention will now be described more fully hereinafter with respect to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the attached figures, the thickness of layers and regions is exaggerated for clarity. Also, when it is mentioned that a layer is "on" another layer or a substrate, the layer can be directly formed on another layer or on a substrate, or a third layer can be interposed therebetween. The same reference numbers indicate the same components throughout the specification.

In figures, a reference mark 'a' indicates a cell array region, and other reference mark 'b' indicates a peripheral circuit region.

Figure 1:
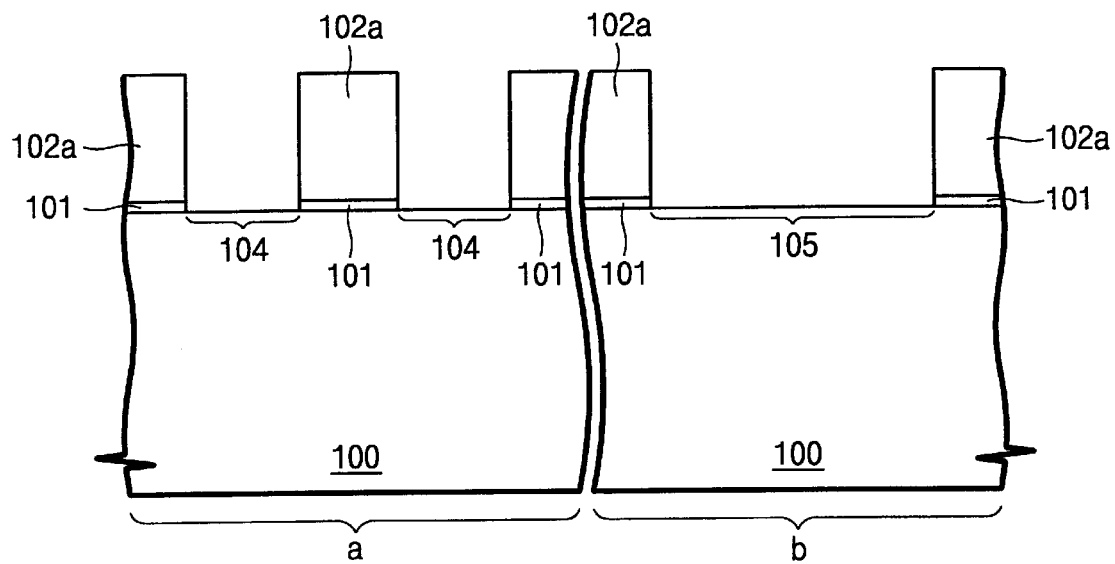
FIGS. 1 through 4 are cross-sectional views illustrating a conventional method of fabricating a trench isolation.
Figure 2:
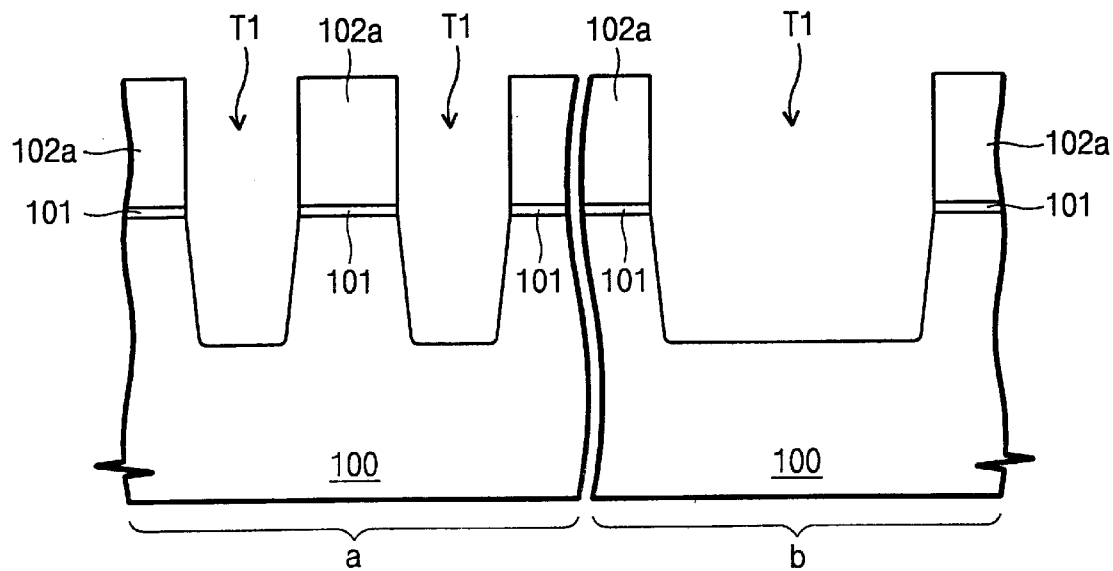
Figure 3:
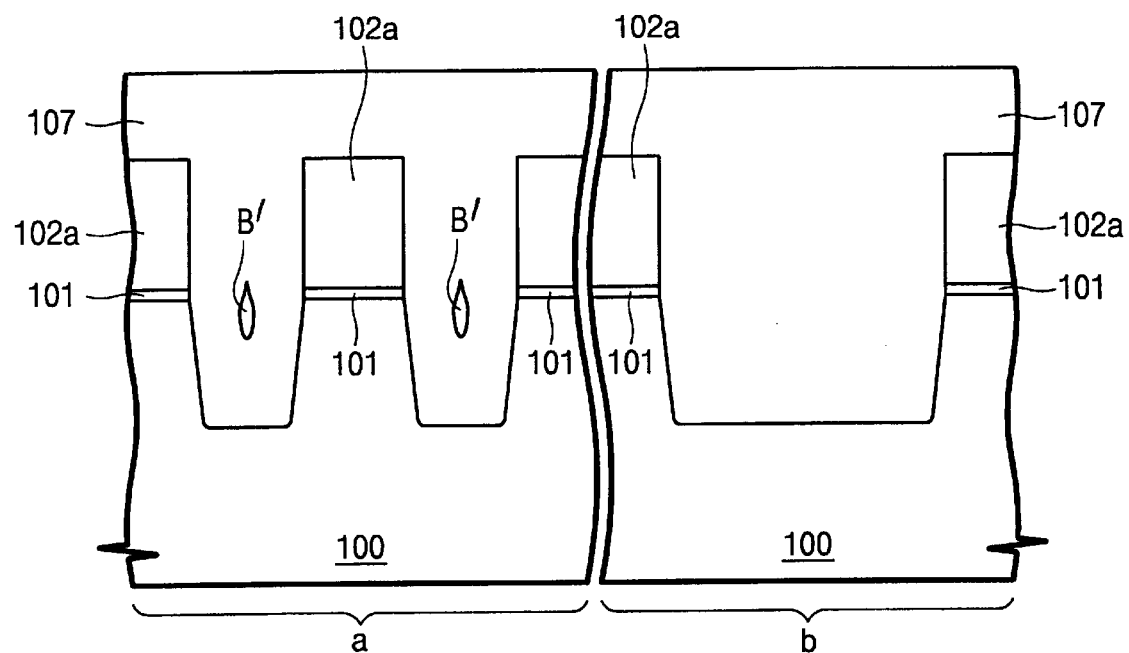
Figure 4:
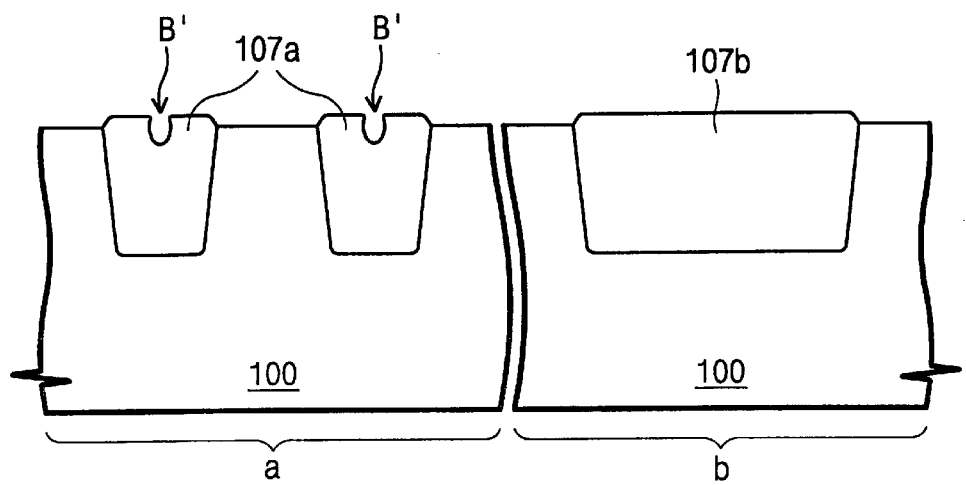
Figure 5:
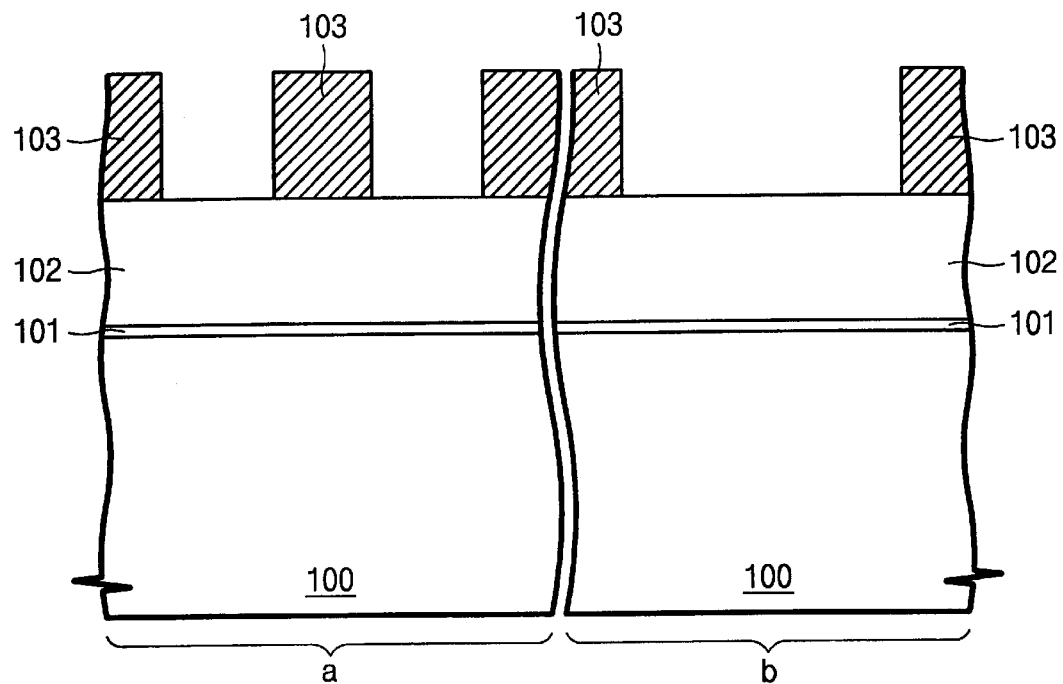
FIGS. 5 through 11 are cross-sectional views illustrating a method of fabricating a semiconductor device according to a preferred embodiment of the present invention.

Referring to FIG. 5, a buffer oxide layer 101 and a hard mask layer 102 are sequentially formed on a semiconductor substrate 100, and a photoresist pattern 103 is formed to define an isolation region on the hard mask layer 102.

The buffer oxide layer 101 functions to prevent generation of crystalline structure defects at the surface of the semiconductor substrate 100 by alleviating a stress applied at the semiconductor substrate 100 by the hard mask layer 102. The buffer oxide layer 101 is preferably formed in a thickness of approximately 50 to 200 Å on the semiconductor substrate.

The hard mask layer 102 is preferably formed of a material layer having an etch selectivity with respect to a sacrificial material layer and an insulation layer formed in a subsequent process, for example, a silicon nitride layer. In this case, the hard mask layer 102 would be preferably thickly formed, considering that the silicon nitride layer is etched in a subsequent step of etching the sacrificial material layer. But in case of thickly forming the hard mask layer 102 with only the silicon nitride layer, a stress applied at the semiconductor substrate 100 would be increased, so that defects of the semiconductor substrate would be further increased. Thus, instead of thickly forming the silicon nitride layer, an oxide layer can be further formed at the top of the silicon nitride layer, thereby forming the hard mask layer 102 composed of the sequentially stacked thin silicon nitride layer and oxide layer.

Figure 6:
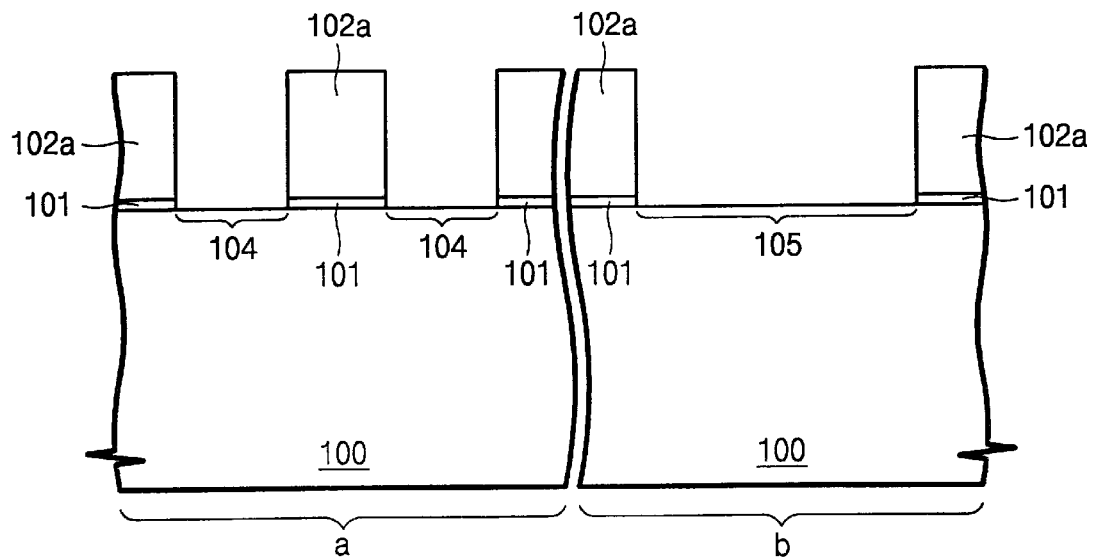

Referring to FIG. 6, the hard mask layer 102 and the buffer oxide layer 101 are patterned by using the photoresist pattern 103 as an etch mask, to form a hard mask pattern 102a on the buffer oxide layer 101 on the semiconductor substrate 100. As a result, a first isolation region 104 and a second isolation region 105 are defined by exposing the semiconductor substrate at the cell array region 'a' and the peripheral circuit region 'b', respectively. Then, the photoresist pattern 103 is removed.

Figure 7:
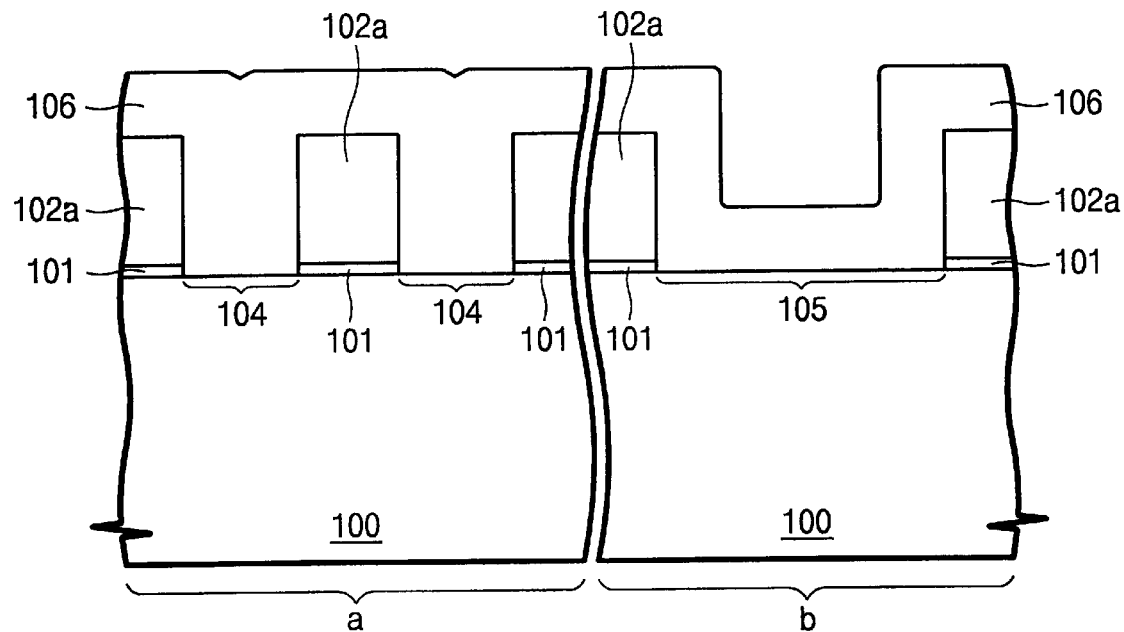

Referring to FIG. 7, a sacrificial material layer 106 is formed at the entire surface of the semiconductor substrate including where the hard mask pattern 102a is formed. At this time, the sacrificial material layer 106 perfectly fills a gap region between the hard mask patterns 102a of the cell array region 'a', and is conformally formed on the second isolation region 105 and the hard mask pattern 102a of the peripheral circuit region 'b'. Preferably, the sacrificial material layer 106 is thicker than a half of the width of the first isolation region 104.

The sacrificial material layer 106 is formed of a material layer having an etch selectivity with respect to the hard mask pattern 102a, for example, preferably, a silicon layer.

Figure 8:
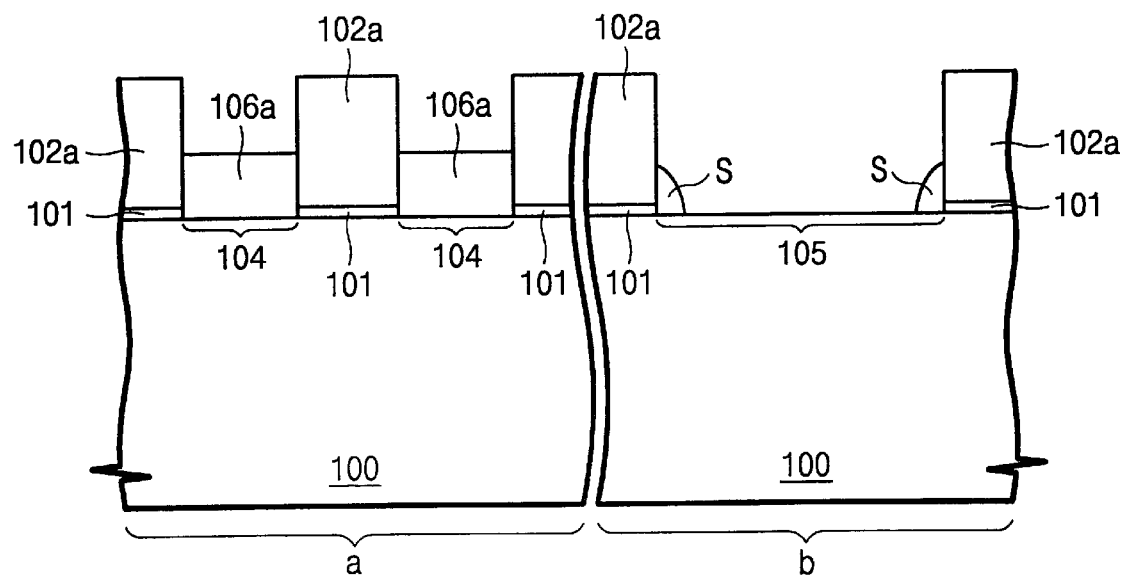

Referring to FIG. 8, the sacrificial material layer 106 is etched by using a method of etching the entire surface, to expose the hard mask pattern 102a and simultaneously to expose the second isolation region 105 of the peripheral circuit region 'b'. At the same time, the sacrificial material layer 106 is left at the top of the first isolation region 104 of the cell array region 'a', to form a sacrificial material layer pattern 106a.

A sacrificial material layer S remaining at the peripheral circuit region 'b' is removed at a subsequent step of etching the semiconductor substrate 100 for forming a trench region. Also, by the thickness of the sacrificial material layer pattern 106a, it is possible to define a depth difference of trenches formed at the cell array region and the peripheral circuit region in a subsequent step.

Figure 9:
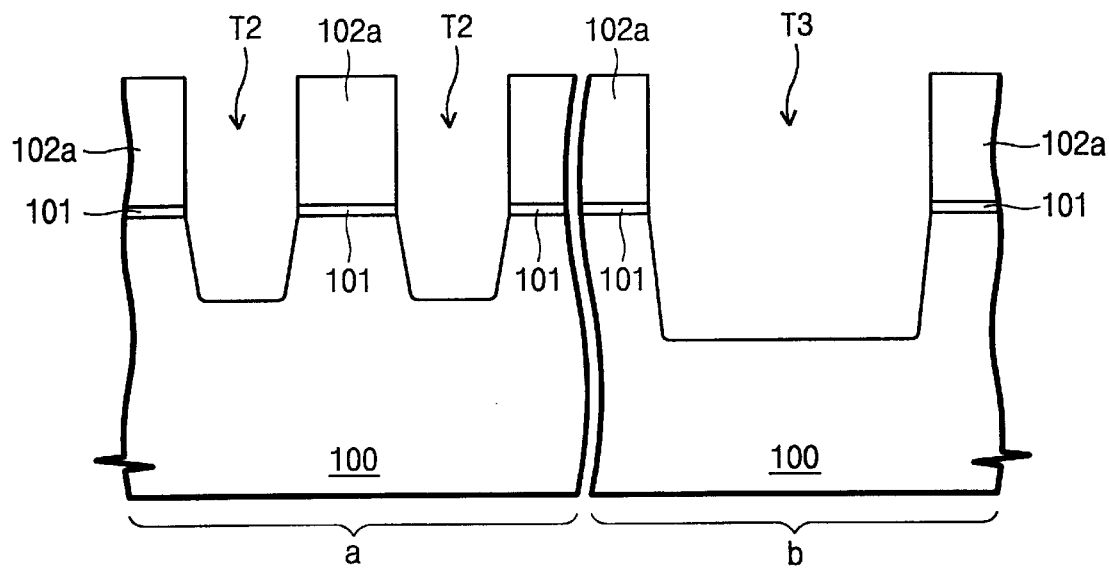

Referring to FIG. 9, the sacrificial material layer pattern 106a and the semiconductor substrate 100 of the cell array region 'a' are sequentially etched by using the hard mask pattern 102a as an etch mask, to form a first trench region T2. And at the same time, the semiconductor substrate 100 of the peripheral circuit region is etched to form a second trench region T3.

At this time, an etch recipe having the same etch selectivity with respect to the sacrificial material layer pattern 106a and the semiconductor substrate 100 is used. Thus, during etching the sacrificial material layer pattern 106a at the cell array region 'a', since the semiconductor substrate of the peripheral circuit region 'b' is etched, the first trench region T2 is formed more shallowly than the depth of the second trench region T3.

Figure 10:
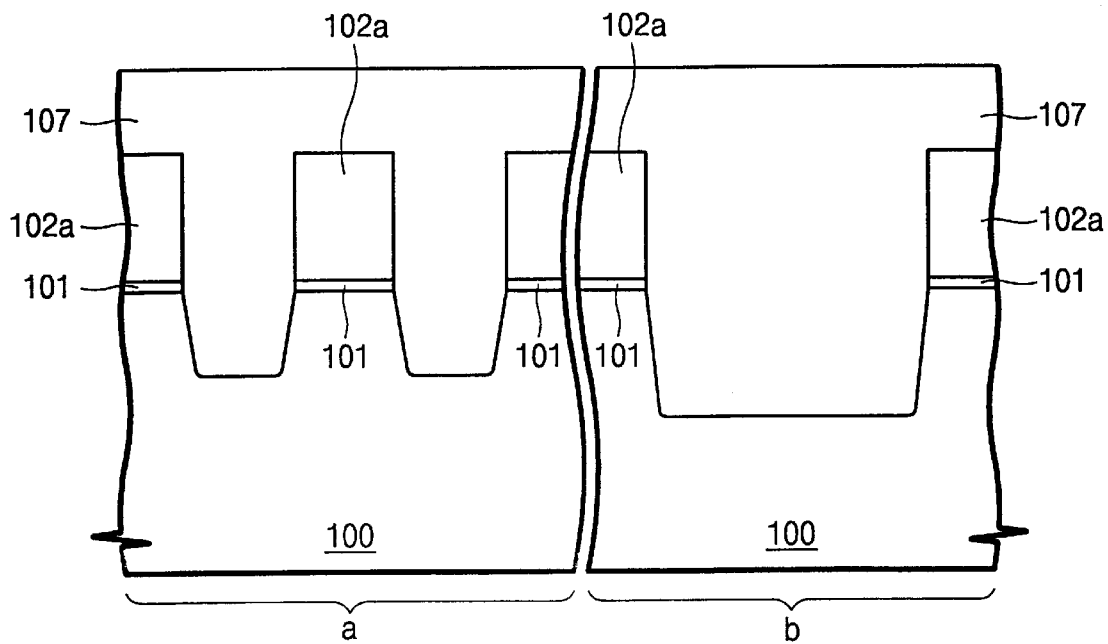

Referring to FIG. 10, an insulation layer 107 is formed to fill the first and second trench regions T2 and T3 at the entire surface of the semiconductor substrate where the first and second trench regions T2 and T3 are formed. Thus, because the depth of the first trench region T2 is shallow in comparison with the conventional technique, it is possible to prevent generation of a void at the cell array region 'a' of the high pattern density in case of forming the insulation layer 107. Before forming the insulation layer 107, a thermal oxide layer is preferably formed at the surfaces of the first and second trench regions T2 and T3, thereby curing surface defects of the semiconductor substrate 100 during an etching process for forming the trench regions. Also, a thin silicon nitride layer is further formed at the entire surface of the semiconductor substrate where the thermal oxide layer is formed. This prevents the undesirable effect of impurities penetrating at the interface between the isolation layer and the semiconductor substrate in a subsequent process. The insulation layer 107 is preferably formed of a material layer having a superior burial characteristic, for example, a $O_3$-TEOS oxide layer or a HDP CVD oxide layer.

Figure 11:
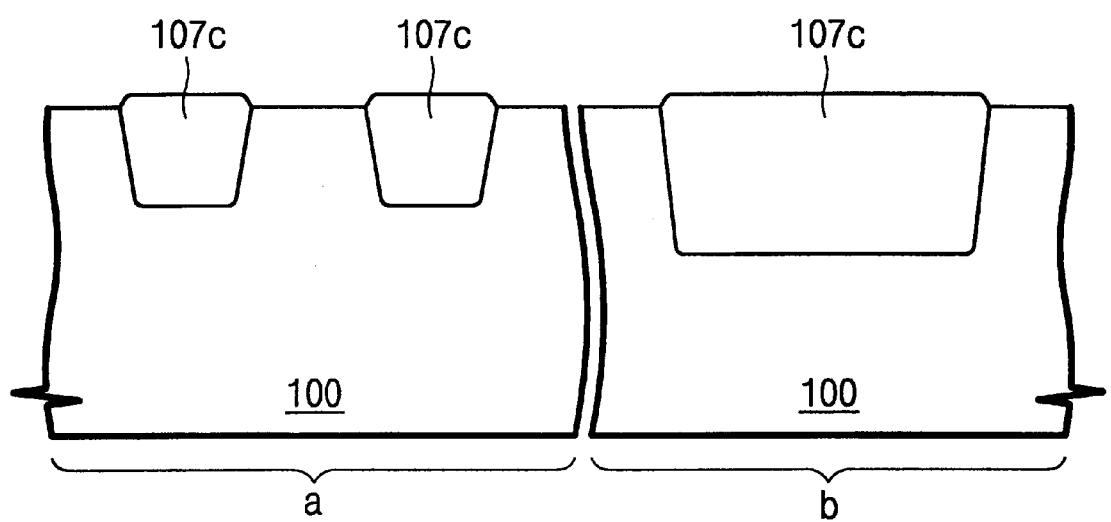

Referring to FIG. 11, the insulation layer 107 is etched by using the CMP process to expose the hard mask pattern 102a, and to form an isolation layer 107c in the first and second trench regions T2 and T3. Then, the hard mask pattern 102a is removed to expose the semiconductor substrate 100.

At the step of polishing the insulation layer 107, the partial top surface of the hard mask pattern 102a is together polished, so that the height of the top surface of the isolation layer 107c can be somewhat low. But, in case that the top surface of the isolation layer 107c is higher than the surface of the semiconductor substrate 100, a conductive layer can be left along the side surface of the isolation layer 107c protruded over the surface of the semiconductor substrate 100 in a subsequent step of patterning a word line. Thus, in order to prevent this, it is desirable that the top surface of the isolation layer 107c is recessed to make the height of the isolation layer 107c similar with that of the surface of the semiconductor substrate 100, before removing the hard mask pattern 102a.

In an alternative form of the preferred embodiment of the present invention, there is a method of etching the sacrificial material layer 106 and the semiconductor substrate 100 by using an etch recipe having an identical etch selectivity, after forming the sacrificial material layer 106.

Referring to FIGS. 7 through 9, until the step of forming the sacrificial material layer 106, the method is identical with the preferred embodiment of the present invention as describe above. Then, the sacrificial material layer 106 and the semiconductor substrate 100 are sequentially etched using the etch recipe having the identical etch selectivity with respect to the sacrificial material layer 106 and the semiconductor substrate 100. At this time, the hard mask pattern 102a is used as an etch stopping layer during etching the sacrificial material layer 107 and the semiconductor substrate 100.

Consequently, the sacrificial material layer 106 on the first isolation region 104 is formed more thickly than that on the second isolation region 105, so that the first trench region T2 of the cell array region 'a' is formed more shallowly than the second trench region of the peripheral circuit region T3. Subsequent processes are identical with the described embodiment.

As described above, the present invention enables to prevent that a void is created when an isolation layer of a region of a high pattern density is formed, and simultaneously to form a semiconductor device having a superior isolation characteristic at a peripheral circuit region including a high voltage-applied region.

A person skilled in the art will be able to practice the present invention in view of the description present in this document, which is to be taken as a whole. In some instances, well-known features have not been described in detail in order not to obscure unnecessarily the invention. While the invention has been disclosed in its preferred form, it should be readily apparent to those skilled in the art in view of the present description that the invention can be modified in numerous ways. The inventor regards the subject matter of the invention to include all combinations and sub-combinations of the various elements, features, functions and/or properties disclosed herein.

What is claimed is:

1. A method of fabricating a semiconductor device comprising the steps of:
    forming a hard mask layer on a semiconductor substrate having a cell array region and a peripheral circuit region;
    patterning the hard mask layer and exposing the semiconductor substrate to form a hard mask pattern defining a first isolation region at the cell array region and simultaneously defining a second isolation region at the peripheral circuit region;
    forming a sacrificial material layer that fills a gap region between the hard mask patterns of the cell array region and is conformally formed over the entire surface of the second isolation region and the hard mask pattern of the peripheral circuit region; and
    sequentially etching the sacrificial material layer and the semiconductor substrate to form the first and second trench regions at the cell array region and the peripheral circuit region, respectively, wherein the first trench region is shallower than the second trench region.

2. The method of claim 1, further comprising a step of forming a buffer oxide layer on the semiconductor substrate before forming the hard mask layer.

3. The method of claim 1, wherein the hard mask layer is formed of a silicon nitride layer.

4. The method of claim 1, wherein the hard mask layer is formed by stacking a silicon nitride layer and an oxide layer.

5. The method of claim 1, wherein the sacrificial material layer is formed of a silicon layer.

6. The method of claim 1, wherein the sacrificial material layer is formed in a thickness of at least a half of a width of the gap region between the hard mask patterns of the cell array region.

7. The method of claim 1, after forming the first and second trench regions, further comprising steps of:
    forming an insulation layer to fill the first and second trench regions;
    etching the insulation layer by using a chemical mechanical polishing (CMP) process to expose the hard mask pattern and simultaneously to form an isolation layer at the first and second trench regions; and
    removing the hard mask pattern to expose the semiconductor substrate between the isolation layers.

8. The method of claim 7, before forming the insulation layer, further comprising a step of forming a thermal oxide layer at the surface of the semiconductor substrate of the first and second trench regions.

9. The method of claim 8, further comprising a step of conformally forming a silicon nitride layer at the entire surface of the semiconductor substrate where the thermal oxide layer is formed.

10. The method of claim 7, before removing the hard mask pattern, further comprising a step of recessing the top of the isolation layer.

11. The method of claim 1, wherein the step of forming the first and second trench regions comprises steps of:
    etching the sacrificial material layer by using a method of etching the entire surface, to expose the hard mask pattern and simultaneously to expose the semiconductor substrate of the second isolation region, but leaving the sacrificial material layer at the top of the first isolation region to form a sacrificial material layer pattern; and
    sequentially etching the sacrificial material layer pattern and the semiconductor substrate of the first isolation region and simultaneously etching the semiconductor substrate of the second isolation region by using the hard mask pattern as an etch mask.

12. The method of claim 1, wherein the step of forming the first and second trench regions comprises a step of sequentially etching the sacrificial material layer and the semiconductor substrate of the first and second isolation regions, wherein the hard mask pattern is used as an etch stopping layer during said etching of the sacrificial material layer and the semiconductor substrate.

* * * * *